United States Patent

Takashina et al.

[11] Patent Number: 5,237,530
[45] Date of Patent: Aug. 17, 1993

[54] ERASABLE NON-VOLATILE SEMICONDUCTOR MEMORY DEVICE HAVING READ/WRITE TEST FUNCTION

[75] Inventors: Nobuaki Takashina; Takao Akaogi; Masanobu Yoshida, all of Kawasaki, Japan

[73] Assignee: Fujitsu Limited, Kanagawa, Japan

[21] Appl. No.: 795,147

[22] Filed: Nov. 20, 1991

[30] Foreign Application Priority Data

Nov. 22, 1990 [JP] Japan .................... 2-315781

[51] Int. Cl.⁵ .................................... G11C 29/00
[52] U.S. Cl. ............................ 365/185; 365/201
[58] Field of Search .............. 365/185, 201, 218; 271/21.2, 21.3

[56] References Cited

U.S. PATENT DOCUMENTS

| | | | |
|---|---|---|---|
| 4,651,304 | 3/1987 | Takata | 365/201 |
| 4,870,618 | 9/1989 | Iwashita | 365/185 |
| 4,956,819 | 9/1990 | Hoffmann et al. | 365/201 |
| 5,124,945 | 6/1992 | Schreck | 365/185 |

Primary Examiner—Eugene R. LaRoche
Assistant Examiner—Tan Nguyen
Attorney, Agent, or Firm—Nikaido, Marmelstein, Murray & Oram

[57] ABSTRACT

An erasable non-volatile semiconductor memory device has a plurality of erasable non-volatile memory cells each comprising two cell transistors, the write statuses of which are inverted, and detects the write status of each memory cell by a differential type detection circuit through first and second bit lines connected to the two cell transistors. Further, the erasable non-volatile semiconductor memory device sets all cell transistors constructing a plurality of the memory cells to the erasing status or write status in entirety, and controls the connection of the first and second bit lines for executing the read/write test. Therefore, the erasable non-volatile semiconductor memory device according to the present invention can reduce the erasing process cycles, which requires a long time, falsely read out the "0" data and "1" data without writing actual data into each memory cell to shorten the test time, and thus can supply a low price product.

12 Claims, 9 Drawing Sheets

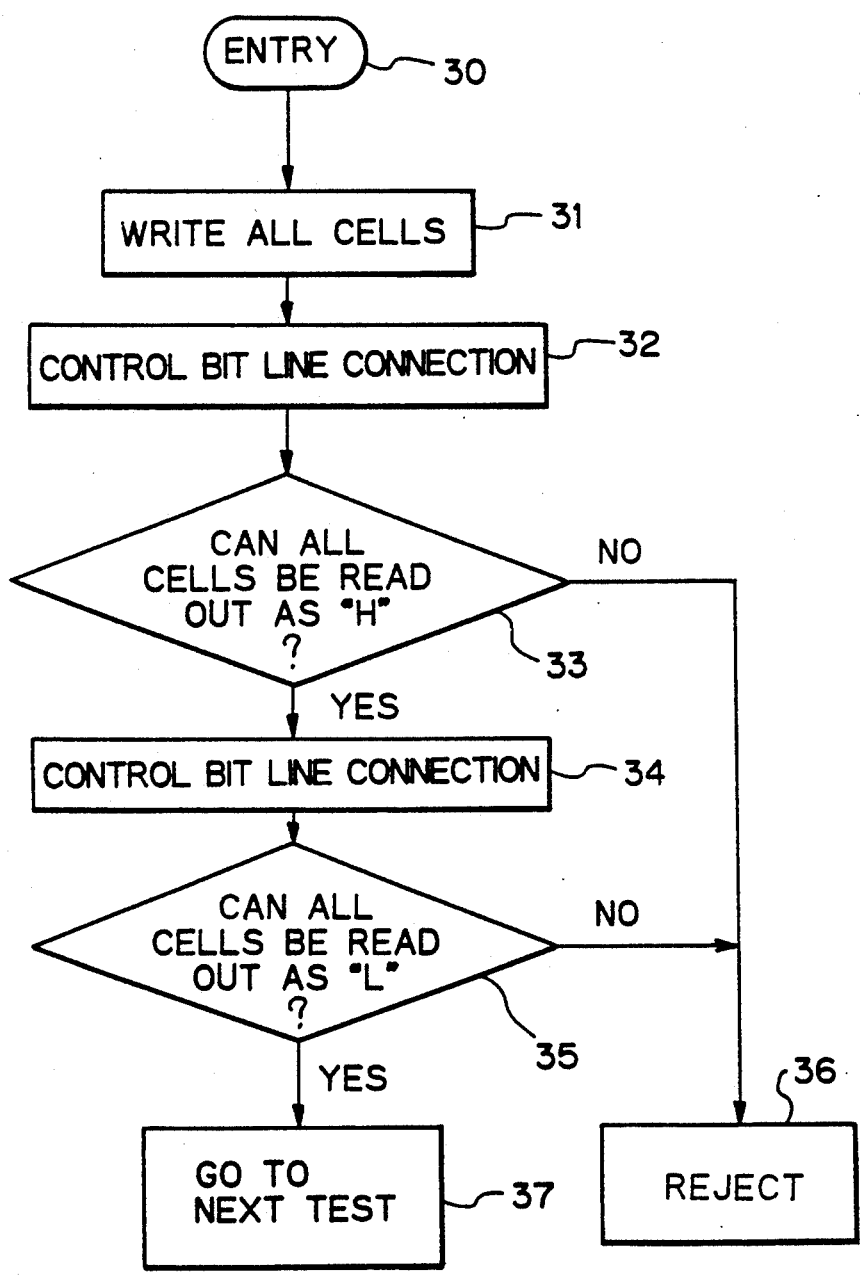

ERASABLE NON-VOLATILE SEMICONDUCTOR MEMORY DEVICE HAVING READ/WRITE TEST FUNCTION

BACKGROUND OF THE INVENTION

1. Field of the Invention

The present invention relates to an erasable non-volatile semiconductor memory device, more particularly, to an erasable non-volatile semiconductor memory device having a plurality of memory cells each comprising two cell transistors and having a differential-type sense amplifier (differential amplifier).

2. Description of the Related Art

Recently, in accordance with a need for higher speed semiconductor integrated circuit devices, the realization of a higher speed has been demanded even in erasable non-volatile semiconductor memory devices (EPROM: Erasable Programmable Read Only Memory). Therefore, as such an EPROM where by a high speed reading operation is realized, it has been proposed that it be provided with a plurality of memory cells each comprising two cell transistors, and be able to read out the content of each of the memory cells by a differential type sense amplifier. An EPROM wherein this memory cell is constituted by two cell transistors, must be able to execute a test of the memory cells in a short time.

SUMMARY OF THE INVENTION

An object of the present invention is to provide an inexpensive erasable non-volatile semiconductor memory device capable of executing a read/write test of all memory cells thereof in a short time.

According to the present invention, there is provided an erasable non-volatile semiconductor memory device having a plurality of erasable non-volatile memory cells each comprising two cell transistors, the write statuses of which are inverted, and detecting the write status of each of the memory cells by a differential type detection circuit through first and second bit lines connected respectively to the two cell transistors of the memory cell to thereby read out the contents of the memory cell, wherein the erasable non-volatile semiconductor memory device comprises: an all cell transistor erasing unit for erasing all of the cell transistors constituting a plurality of the memory cells; a first test unit for cutting off the first bit line connected to one of the cell transistors from the differential type detection circuit, and for connecting the second bit line connected to the other of the cell transistors of the memory cell to the differential type detection circuit, to carry out a test of a first write level; a second test unit for cutting off the second bit line from the differential type detection circuit, and for connecting the first bit line to the differential type detection circuit, to carry out a test of a second write level; an all cell transistor write unit for writing all of the cell transistors constituting a plurality of the memory cells; a third test unit for connecting the second bit line to the ground, and for connecting the first bit line to the differential type detection circuit, to carry out a test of the first write level; and a fourth test unit for connecting the first bit line to the ground, and for connecting the second bit line to the differential type detection circuit, to carry out a test of the second write level, to thereby execute a read/write test of all of the memory cells.

According to the present invention, there is also provided an erasable non-volatile semiconductor memory device, having a plurality of erasable non-volatile memory cells each comprising two cell transistors, the write statuses of which are inverted, and detecting the write status of each of the memory cells by a differential type detection circuit through first and second bit lines connected respectively to the two cell transistors of the memory cell, to thereby read out the contents of the memory cell, wherein the erasable non-volatile semiconductor memory device comprises: an all cell transistor erasing unit for erasing all of the cell transistors constituting a plurality of the memory cells; a first test unit for connecting the first bit line connected to one of the cell transistors to a power supply unit to carry out a test of a first write level; a second test unit for connecting the second bit line connected to the other of the cell transistors to the power supply unit to carry out a test of a second write level; an all cell transistor write unit for writing all of the cell transistors constituting a plurality of the memory cells; a third test unit for connecting the second bit line to the ground to carry out a test of the first write level; and a fourth test unit for connecting the first bit line to the ground to carry out a test of the second write level, to thereby execute a read/write test of all of the memory cells. Further, according to the present invention, there is provided an erasable non-volatile semiconductor memory device, having a plurality of erasable non-volatile memory cells each comprising two cell transistors, the write statuses of which are inverted, and detecting the write status of each of the memory cells by a differential type detection circuit through first and second bit lines connected respectively to the two cell transistors of the memory cell, to thereby read out the contents of the memory cell, wherein the erasable non-volatile semiconductor memory device comprises: an all cell transistor write unit for writing all of the cell transistors constituting a plurality of the memory cells; a first test unit for connecting the second bit line to the ground to carry out a test of the first write level; and a second test unit for connecting the first bit line to the ground to carry out a test of the second write level, to thereby execute a read/write test of all of the memory cells.

The cell transistors may be constituted by floating gate avalanche injection MIS transistors. The cutting-off process of either the first bit line or the second bit line may be carried out by a switching elements provided between each of two cell transistors of the memory cell and the differential type detection circuit and controlled during a test of the memory cells.

According to the preset invention, there is provided a read/write test method for an erasable non-volatile semiconductor memory device having a plurlatiy of erasable non-volatile memory cells each comprising two cell transistors, the write statuses of which are inserted, and detecting the write status of each of the memory cells by a differential type detection circuit through first and second bit lines connected respectively to the two cell transistors of the memory cell, to thereby read out the contents of the memory cell, wherein the read/write test method comprises the steps of: erasing all of the cell transistors constituting a plurality of the memory cells; cutting off the first bit line connected to one of the cell transistors from the differential type detection circuit, and connecting the second bit line connected to the other of the cell transistors of the memory cell to the differential type detection circuit to carry out a test of a first write level; cutting off the second bit line from the differential type detection circuit, and connecting the first bit line to the differential type detection circuit to carry out a test of a second write level; writing all of the cell transistors constituting a plurality of the memory cells; connecting the second bit line to the ground, and for connecting the first bit line to the differential type detection circuit to carry out the a of the first write level; and connecting the first bit line to the ground, and for connecting the second bit line to the differential type detection circuit to carry out a test of the second write level, whereby a read/write test of all of the memory cells is executed.

According to the present invention, there is also provided a read/write test method for an erasable non-volatile semiconductor memory device having a plurality of erasable non-volatile memory cells each comprising two cell transistors, the write statuses of which are inverted, and detecting the write status of each of the memory cells by a differential type detection circuit through first and second bit lines connected respectively to the two cell transistors of the memory cell, to thereby read out the contents of the memory cell, wherein the read/write test method comprises the steps of: erasing all of the cell transistors constituting a plurality of the memory cells; connecting the first bit line connected to one of the cell transistors to a power supply unit to carry out a test of a first write level; connecting the second bit line connected to the other of the cell transistors to the power supply unit to carry out a test of a second write level; writing all of the cell transistors constituting a plurality of the memory cells; connecting the second bit line to the ground to carry out a test of the first write level; and connecting the first bit line to the ground to carry lout the test of a second write level, whereby a read/write test of all of the memory cells is executed.

Further, according to the present invention, there is provided a read/write test method for an erasable non-volatile semiconductor memory device having a plurality of erasable non-volatile memory cells each comprising two cell transistors, the write statuses of which are inverted, and detecting the write status of each of the memory cells by a differential type detection circuit through first and second bit lines connected respectively to the two cell transistors of the memory cell to thereby read out the contents of the memory cell, wherein the read/write test method comprises the steps of: writing all of the cell transistors constituting a plurality of the memory cells; connecting the second bit line to the ground to carry out a test of the first write level; and connecting the first bit line to the ground to carry out a test of the second write level, to thereby execute a read/write test of all of the memory cells.

BRIEF DESCRIPTION OF THE DRAWINGS

The present invention will be more clearly understood from the description of the preferred embodiments as set forth below with reference to the accompanying drawings, wherein:

FIG. 9 is a flow chart of an example of the test process of the erasable non-volatile semiconductor memory device shown in FIG. 8.

DESCRIPTION OF THE PREFERRED EMBODIMENTS

First, an erasable non-volatile semiconductor memory device according to the related art will be explained, with reference to FIGS. 1 and 2.

Figure 1:
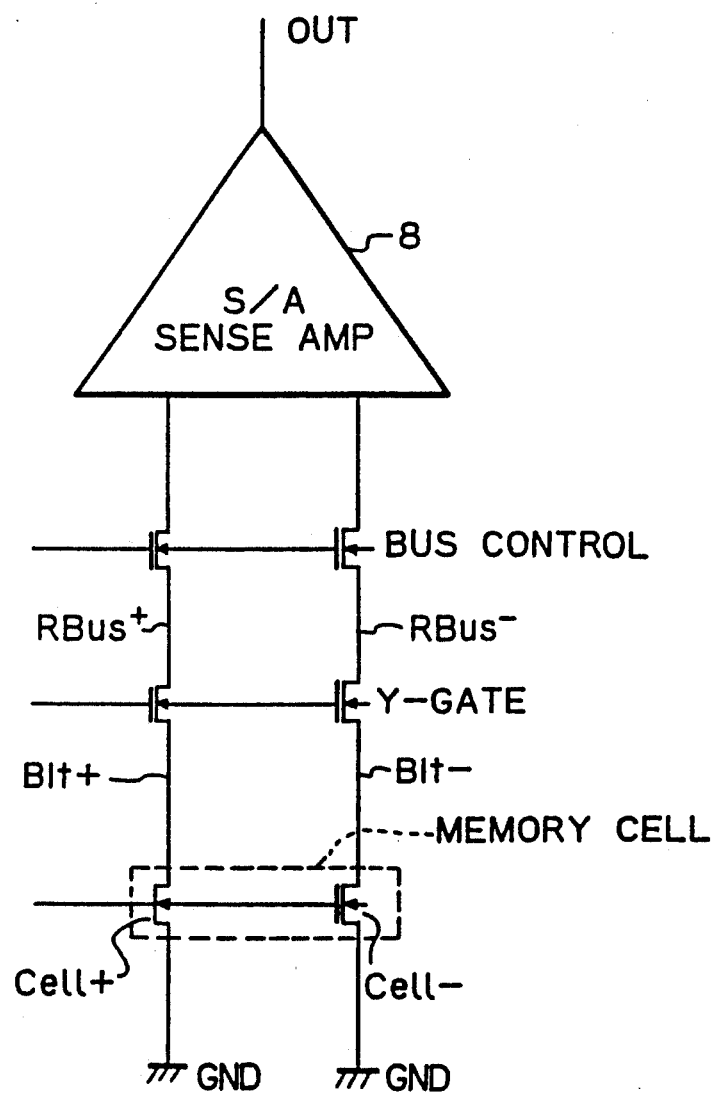
FIG. 1 is a block circuit diagram of an example of an erasable non-volatile semiconductor memory device according to the related art.

FIG. 1 is a block circuit diagram indicating an example of an erasable non-volatile semiconductor memory device according to the related art, and showing an EPROM (Erasable Programmable Read Only Memory) enabling a high speed read operation by building up a memory cell with two cell transistors.

As shown in FIG. 1, the EPROM comprises a plurality of memory cells, and each of the memory cells includes two floating gate avalanche injection MIS (FAMIS) transistors Cell− and Cell+. These FAMIS transistors set the write status wherein the FAMIS transistor Cell− on one side and the FAMIS transistor Cell+ on the other side have been reversed, and detects and reads the contents of each of the memory cells by the differential type detection circuit (sense amp) connected through the bit lines Bit− and Bit+ to the FAMIS transistors Cell− and Cell+. Namely, the output OUT of the sense amp 8 is decided by the potential level of bus line RBus+(bit line Bit+) against the bus line RBus−(bit line Bit−).

As described above, the EPROM shown in FIG. 1 can shorten the time (the time required until the level of the bit lines changes) required for a level change of the bit lines during the read operation of the general EPROM in the past (which builds up the memory cell with on FAMIS transistor) and enables a high speed read operation. The data, however, must be written in a status wherein it has been reversed into two FAMIS transistors Cell− and Cell+building up the memory cell. Namely, the data must be stored by writing it into only one of two FAMIS transistors Cell− and Cell+.

Note, to guarantee the write for all of the bits, the read/write test of semiconductor memory device is generally required for all of the memory cells.

Figure 2:
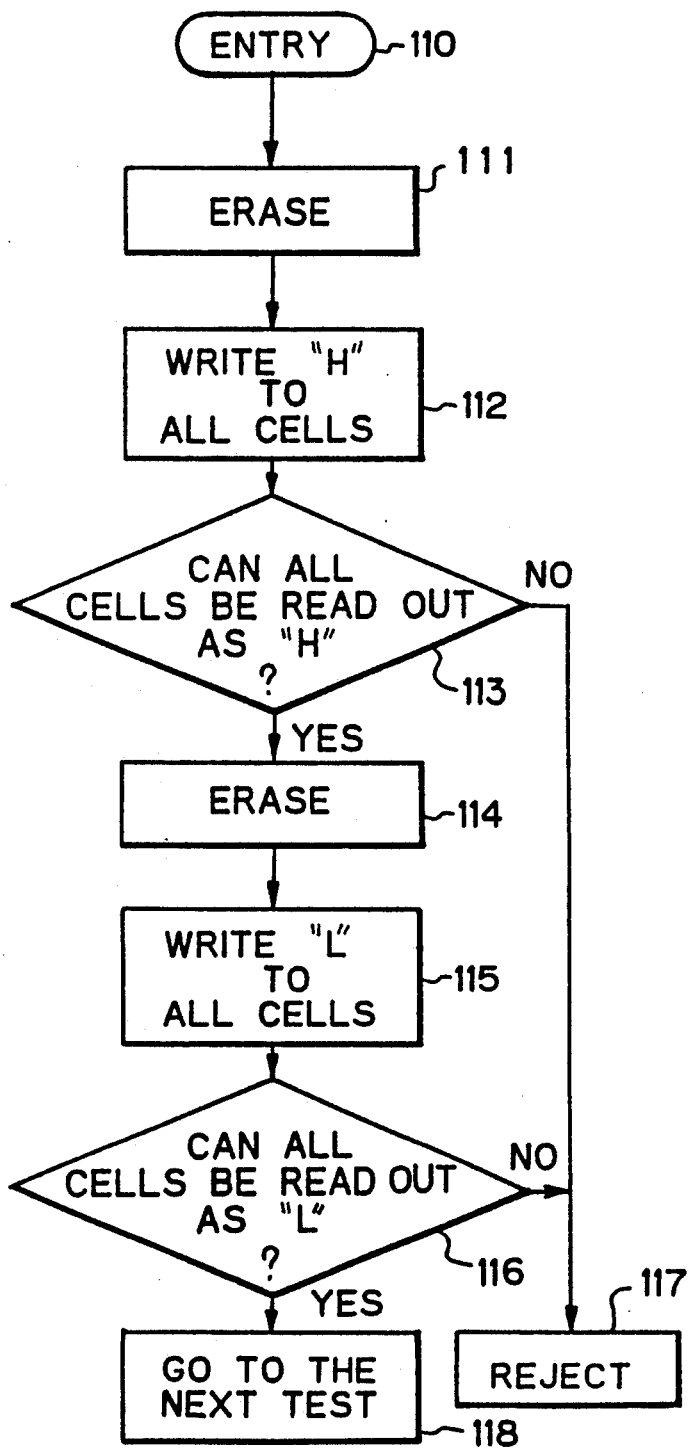
FIG. 2 is a flow chart of an example of a test process of the erasable non-volatile semiconductor memory device shown in FIG. 1.

FIG. 2 is a flow chart indicating an example of a test process of the erasable non-volatile semiconductor memory device shown in FIG. 1.

As shown in FIG. 2, when the read/write test against the EPROM memory cell should be entered at Step 110, first an ultraviolet ray, for example, is irradiated at Step 111 to erase the contents of all of the memory cells, and the step then proceeds to Step 112, where "H" (1-data) is written to all of the memory cells. For example, one transistor (Cell−) of two FAMIS transistors (cell transistors) Cell— and Cell+ of each memory cell is set entirely to the write status (the status wherein the electrons have been injected into the floating age) and the other transistor (Cell+) is set entirely to the non-write status (the status where no electrons have been injected into the floating gate), and then "H" is written to all of the memory cells. The flow then proceeds to Step 113 and a test is carried out to determine whether all memory cells can be read as "H". Namely, the test is made determine whether "H" has been written to all memory cells and can be read out correctly or not.

If all memory cells can be read out as "H" in Step 113, i.e., when the read/write test of "H" for all memory cells id finished, the flow proceeds to Step 114 and an ultraviolet ray, for example, is irradiated to erase all memory cells in the same way as in the Step 111, and then advances to Step 115. For reference, if all memory cells can not be read out as "H" at Step 113, the flow proceeds to Step 117 and the tested EPROM is discarded as a rejected product.

Next, at Step 115, "L" (0-data) is written to all of the memory cells, contrary to Step 112. For example, one transistor (Cell+) of two FAMIS transistors Cell— and Cell+ of each memory cell is set to the write status and the other transistor (Cell—) is set to the non-write status, and then "L" is written to all memory cells. The flow then proceeds to Step 116 and a test is conducted to determine whether all memory cells can be read out as "L". Namely, the test is made to determine whether "L" has been written to all memory cells, and can be read out correctly.

If all memory cells can be read out as "L" at Step 116, i.e., if the read/write test of "L" against all memory cells is finished, the flow advances to Step 118 and the next test is executed. At this stage, it is considered that the read/write test for the memory cells of EPROM was successful. Note, if all of the memory cells can not be read out as "L" at Step 113, the flow proceeds to Step 117 and the tested EPROM is discarded as an unacceptable product.

As described above, the conventional EPROM, which enables a high speed read operation by structuring the memory cell with two cell transistors must be twice irradiated with ultraviolet ray, for erasing the cells (Steps 111 and 114 in the flow chart of FIG. 2), when carrying out the read/write test of the memory cells of the EPROM.

Note, the erasing process conducted by irradiating ultraviolet rays takes from several minutes to several tens of minutes, and thus conducting this erasing by irradiating the ultraviolet rays twice prolongs the read/write test, and accordingly, increases production costs.

The preferred embodiments of an erasable non-volatile semiconductor memory device according to the present invention are now explained with reference to the accompanying drawings.

Figure 3:
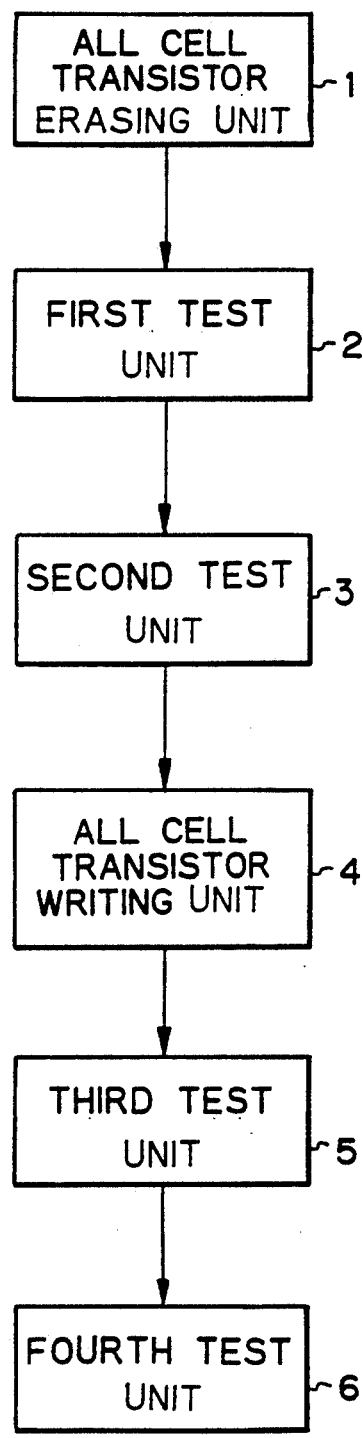
FIG. 3 is a block diagram of a principle of a first aspect of an erasable non-volatile semiconductor memory device according to the present invention.

FIG. 3 is a block diagram indicating a principle of a first aspect of an erasable non-volatile semiconductor memory device according to the present invention.

As shown in FIG. 3, in the first aspect of an erasable non-volatile semiconductor memory device according to the present invention, all of the cell transistors constituting a plurality of memory cells are erased first by an all cell transistor erasing unit 1.

Next, a first bit line Bit— connected to one cell transistor Cell— of the memory cell is cut off by the first test unit 2, a second bit line Bit+ connected to the other cell transistor Cell+ of the memory cell is connected to a differential type detection circuit 8, and a first write level "H" is tested. This first test unit 2 conducts a read test in a state where the detection circuit 8 regards the cell transistor Cell— on one side building up the memory cell as in the write status (the status wherein electrons have been injected into the floating gate), and regards the cell transistor Cell+ on the other side as in the non-write status (the erasing status: the status where the electrons have not been injected into the floating gate), for example, the test is carried to determine whether all of the memory cells can be read out as "H", by cutting off the first bit line Bit— when all cell transistors Cell— and Cell+ are erased.

Further, contrary to the first test unit 2, the second bit line Bit+ is cut off by the second test unit 3, the first bit line Bit— is connected to the detection circuit 8, and the second write level "L" is tested. This second test unit 3 conducts a read test wherein the detection circuit 8 considers the cell transistor Cell+ on the other side building up the memory cell as in the write status, and regards the cell transistor Cell— as in the non-write status, for example, the test is carried out to determine whether all memory cells can be read out as "L", by cutting off the second bit line Bit+ while all of the cell transistors Cell— and Cell+ are erased.

Next, all of the transistors Cell— and Cell+ building up a plurality of memory cells are set to the write status by an all cell transistor write unit 4. Further, the second bit line Bit+ is connected to the ground GND by the third test unit 5, as for the first test unit 2, and the first bit line Bit— is connected to the detection circuit 8, and then the first write level "H" is tested. Furthermore, the first bit line Bit— is connected to the ground GND, the second bit line Bit+ is connected to the detection circuit 8 by the fourth test unit 6, as for the second test unit 3, and then the second write level "L" is tested.

According to the erasable non-volatile semiconductor memory device of this invention, the read/write test of all memory cells can be executed by once conducting the erasing process, for example, by irradiating the ultraviolet rays for a time of several minutes to several tens of minutes, as described above. Consequently, according to the present invention, the test time can be made much shorter than that of the conventional test method.

Figure 4:
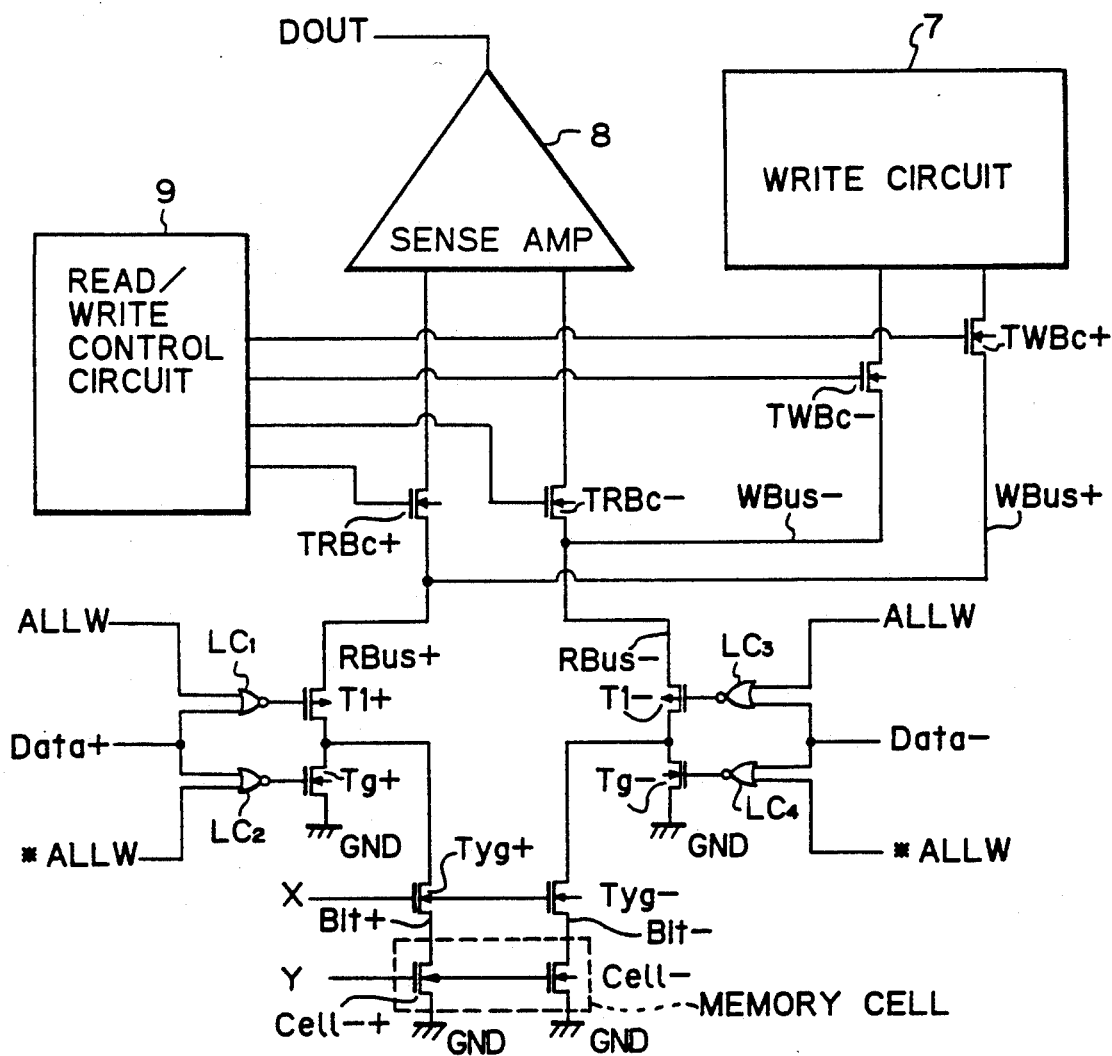
FIG. 4 is a block diagram of an embodiment of an erasable non-volatile semiconductor memory device according to the present invention.

FIG. 4 is a block circuit diagram indicating an embodiment of an erasable non-volatile semiconductor memory device according to the present invention. In FIG. 4, 7 denotes a write circuit, 8 denotes a sense amp, and 9 denotes a read/write control circuit.

As shown in FIG. 4, the erasable non-volatile semiconductor memory device (EPROM) according to this embodiment builds up each memory cell with 2 floating gate avalanche injection MIS (FAMIS) transistors Cell— and Cell+, sets the FAMIS transistor Cell— on one side and the FAMIS transistor Cell+ on the other side, to the reverse write status and reads the contents of each of the memory cells by the differential type detection circuit (sense amp) 8 connected to the FAMIS transistors (cell transistors) Cell— and Cell+ through the bit lines Bit— and Bit+. Note, the output DOUT of the sense amp 8 is determined by the level of the potential of a bus line RBus+ (bit line Bit+) against the potential of a bus line RBus— (bit line Bit—). The EPROM in this FIG. 2 can shorten the time (the time required until the level of bit line can be determined) required for a level change of a bit line during a read process in the EPROM (which has built up the memory cell with a single FAMIS transistor) according to the related art, and thus a high speed read operation can be realzied the same reason as explained with reference to FIG. 1. Further, the data must be written in the status which has been inverted at two FAMIS transistors Cell—and Cell+building up the memory cell, and must store the data in the same way as the EPROM of FIG. 5, by conducting a write process into only the transistor on one side, of the two FAMIS transistors Cell—and Cell+.

Note, the reference codes TRBc+and TRBc—in FIG. 4 denote read-control transistors connected to a read/write control circuit 9, and connect the sense amp 8 to the bus lines (bit lines Bit—and Bit+) during a read-out operation. Further, the reference codes TWBc—and TWBc+denote write—control transistors connected to the read/write control circuit 9 and connect the write circuit 7 to the bit lines Bit—and Bit+-during the write operation. Furthermore, the reference codes Cell—and Cell+denote 2 FAMIS transistors building up each memory cell, the RBus—and RBus+; WBus—and WBus+denote the respective node names, and the Bit—and Bit+indicate the bit lines between each FAMIS transistor and sense amp 8. Note, transistors Tyg—and Tyg+are switch-controlled by a signal X, and the FAMIS transistors Cell—and Cell+are switch-controlled by a signal Y.

As clearly seen from FIG. 4, in the EPROM of this embodiment, test-control transistors T1—and T1+are provided between the bit lines Bit—and Bit+and the sense amp 8 (write circuit 8), and test-control transistors Tg—and Tg+are provided between the bit lines Bit- —and Bit+and the ground GND. These test control transistors T1—and Tg—; T1+and Tg+are controlled by write signals ALLW and *ALLW (the inverse signal of ALLW) and data Data+and Data—through logic circuits (NOR gates LC$_1$, LC$_2$, LC$_3$ and LC$_4$).

Figure 5:
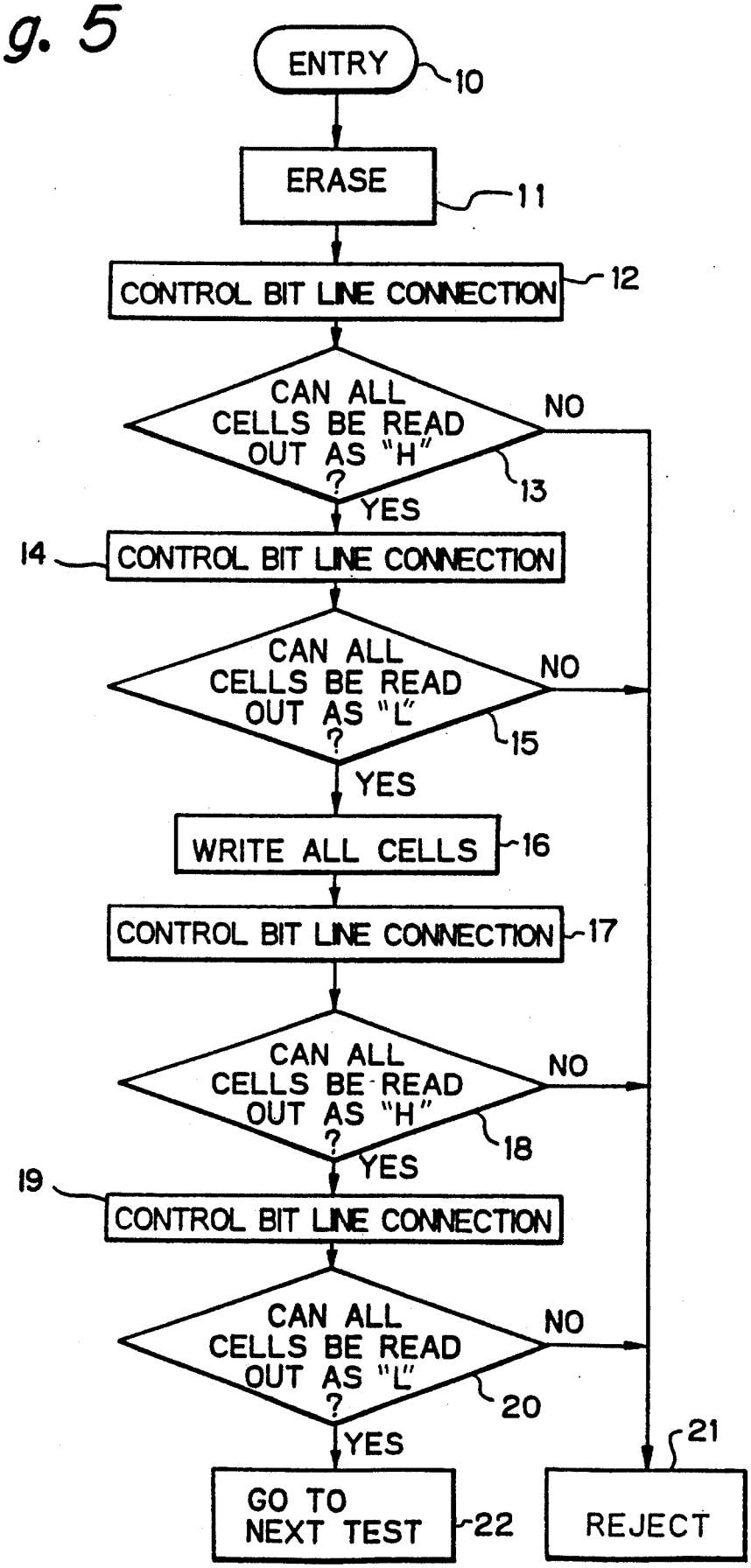
FIG. 5 is a flow chart of an example of the test process of the erasable non-volatile semiconductor memory device shown in FIG. 4.

FIG. 5 is a flow chart indicating an example of a test process of the erasable non-volatile semiconductor memory device shown in FIG. 4. Note, the status wherein the write has been made only to the transistor Cell—on one side of a pair of FAMIS transistors building up each memory cell is taken as 1-data "H", i.e., the status wherein the level of bit line Bit—(RBus—) connected to the transistor Cell—on one side is higher than the level of bit line Bit+(RBus+) connected to the transistor Cell+on the other side is taken as "H", and conversely, the status wherein the write is done only to the transistor Cell+on the other side shall be taken as 0-data "L", i.e., the status wherein the level of bit line Bit+(RBus+) connected to the transistor Cell+on the other side is higher than the level of bit line Bit—(-RBus—) connected to the transistor Cell—on one side is taken as "L". Also, the signal ALLW becomes a high level "H" after writing the data to both the transistors Cell—and Cell+building up the memory cell, and therefore, the *ALLW becomes low level "L" after writing the data to both the transistors Cell—and Cell- +building up the memory cell.

As shown in FIG. 5, when the read/write test is to entered for the memory cell of the EPROM at Step 10, ultraviolet rays, for example, are irradiated to erase all of the memory cells at Step 11. Through this erasion processing by ultraviolet rays, all of the cell transistors Cell—and Cell+are set to the non-write status wherein electrons have not been injected into the floating gate, the selected cell transistors Cell—and Cell+are electrified, and the potentials of bit lines Bit—and Bit+connected to the cell transistors Cell—and Cell+are low level "L".

Next, the connection of bit lines Bit—and Bit+is controlled at Step 12, the bit line Bit—connected to the cell transistor Cell—is cut off, and the bit line Bit+connected to the cell transistor Cell+is connected to the sense amp 8. Namely, because the signal ALLW is at a low level "L" and the signal *ALLW is at a high level "H", at the steps ahead of Step 16, the outputs of NOR gates LC$_1$, LC$_2$ and LC$_4$ are set to a low level "L" and the output of the NOR gate LC$_3$ is set to a high level "H", by setting a signal Data—to a low level "L" nd setting a signal Data+to a high level "H". Therefore, the transistor Tr+becomes OFF and the test controlling transistor T1+becomes ON, and further, the transistor Tg—becomes OFF and the test controlling transistor T1—becomes OFF, and therefore, the bit line Bit—is shut off and the bit line Bit+is connected to the sense amp 8. The flow then proceeds to Step 13, and it is determined whether all memory cells can be read out as "H". Namely, because all memory cells are in the status wherein the "H" (1-data) has been falsely written thereto, the read-out test of the cell transistor Cell+in the non-write status is to be conducted. Note, at Step 13, if all memory cells can not be read out as "H", the flow advances to Step 21 and the tested EPROM is discarded as a defective product.

Proceeding to Step 14 the bit line connection is inverse to that at the Step 12, i.e., the bit line Bit+connected to the cell transistor Cell+is cut off, and the bit line Bit—connected to the cell transistor Cell—is connected to the sense amp 8. Concretely, because the signal ALLW is at a low level "L" and the signal *ALLW is at a high level "H", the output of the NOR gate LC$_1$ is set to a high level "H" and the outputs of the NOR gates LC$_2$, LC$_3$ and LC$_4$ are set to a low level "L", by setting the signal Data—to a high level "H" and setting the signal Data+to a low level "L". Therefore, the transistor Tg—becomes OFF and the test controlling transistor T1—becomes ON, and the transistor TG+becomes OFF and the test controlling transistor T1+becomes OFF, and the test controlling transistor T1+becomes OFF, and therefore, the bit line Bit+is cut off and the bit line Bit—is connected to the sense amp 8. Further, at Step 15, it is determined whether all memory cells can be read out as "L". Note, because all memory cells are in the status wherein the "L" (0-data) has been falsely written thereto, the read test of non-write state cell transistor Cell—is conducted. Note, at Step 15, if all memory cells can not be read out as "L", the step proceeds to Step 21 and the tested EPROM is discarded as a rejected product. Further, if all memory cells can be read out as "L" at Step 15, i.e., if all transistors building up the memory cells after passing through the Steps 13 and 15 have passed the read/write test of "H" and "L" for all memory cells in a non-write status, the flow advances to Step 16 and the write process is conducted for all memory cells. Note, during and after the write process for all cells at the Step 16, the signal ALLW becomes high level "H". Further, through the write processing at the Step 16, all cell transistors Cell- —and Cell+are in a status wherein the electrons have been injected into the floating gate, and the selected cell transistors Cell—and Cell+are not electrified.

The flow then proceeds to Step 17 and the connections of bit lines Bit—and Bit+are controlled, the bit line Bit+connected to the cell transistor Cell+is connected to the ground GND, and the bit line Bit− connected to the cell transistor Cell− is connected to the sense amp 8. Namely, because the signal ALLW is at a high level "H" and the signal *ALLW is at a low level "L", at the steps following Step 16, the outputs of the NOR gates LC$_1$, LC$_3$ and LC$_4$ are set to a low level "L" and the output of the NOR gate LC$_2$ is set to a high level "H" by setting the signal Data− to a high level "H" and setting the signal Data+ to a low level "L". Therefore, the transistor Tg+ becomes ON and the test control transistor Tl+ becomes ON status, and the transistor Tg− becomes OFF and the test control transistor Tl− becomes ON, and therefore, the bit line Bit+ is connected to the ground GND and the bit line Bit− is connected to the sense amp 8. The flow then proceeds to Step 18, and then determined whether all memory cells can be read out as "H". Note, because all memory cells are in the status wherein the "H" (1-data) has been falsely written thereinto, the read test of the cell transistor Cell− in the write state is conducted. If all memory cells can not be read out as "H" at the Step 18, the flow proceeds to the Step 21 and the tested EPROM is discarded as an unacceptable product.

The flow then proceeds to Step 19 and the bit line connection is inverse to that at the Step 17, i.e., the bit line Bit− connected to the cell transistor Cell− is connected to the ground GND, and the bit line Bit+ connected to the cell transistor Cell+ is connected to the sense amp 8. Concretely, because the signal ALLW is set to a high level "H" and the signal *ALLW is set to a low level "L", the outputs of the NOR gates LC$_1$, LC$_2$ and LC$_3$ are set to a low level "L" and the output of the NOR gate LC$_4$ is set to a high level "H" by setting the signal Data− to a low level "L" and setting the signal Data+ to a high level "H". Therefore, the transistor Tg+ becomes OFF and the test control transistor Tl+ becomes ON and the transistor Tg− becomes ON and the test control transistor Tl− becomes ON, and therefore, the bit line Bit− is connected to the ground GND and the bit line Bit+ is connected to the sense amp 8. The flow then proceeds to Step 20, and it is determined whether all memory cells can be read out as "L". Namely, because all memory cells are in the status wherein the "L" (0-data) has been falsely written thereto, a read test of the cell transistor Cell+ in a non-write state is carried out.

When all memory cells have been read out as "L" at Step 20, i.e., when the read/write test of "L" has been completed for all memory cells, the flow proceeds to Step 22 and the read/write test for the memory cell of the EPROM is regarded as completed and the next test is conducted. Note, if all memory cells can not be read out as "L" at the Step 20, the flow proceeds to the Step 21 and the tested EPROM is discarded as an unacceptable product.

Figure 6:
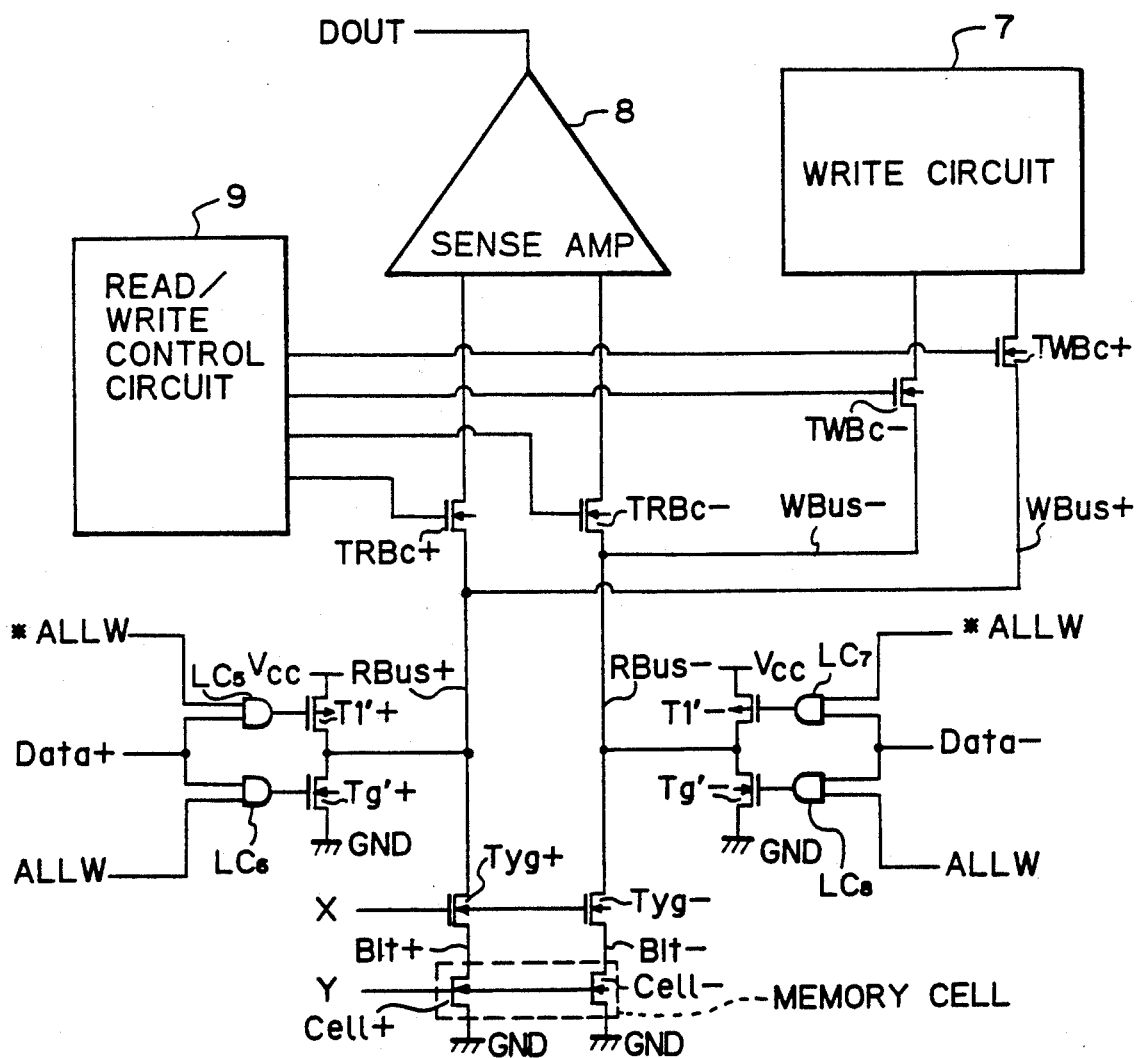
FIG. 6 is a block circuit diagram of a modified example of the erasable non-volatile semiconductor memory device shown in FIG. 4.

FIG. 6 is a block circuit diagram indicating a modified example of the erasable non-volatile semiconductor memory device shown in FIG. 4.

As shown in FIG. 6, the EPROM is considered to be basically identical to the EPROM of FIG. 4, but in the present embodiment, the two cell transistors Cell− and Cell+ building up a memory cell are connected directly to the sense amp 8 through the bit lines Bit− and Bit+. Note, the test control transistor Tl′− for switching the power source Vcc and the test controlling transistor Tg′− for switching the ground GND are connected to the bit line Bit−, and the test controlling transistor Tl′+ for switching the power source Vcc and the test control transistor Tg′+ for switching the ground GND are connected to the bit line Bit+. Note, these test controlling transistors Tl′− and Tg′− as well as Tl′+ and Tg′+, are controlled by the write signals ALLW and *ALLW (inverse signal of ALLW) and by the data Data+ and Data− through the logic circuits (AND gates LC$_5$, LC$_6$, LC$_7$ and LC$_8$).

After all the memory cells have been erased in the EPROM of this embodiment, i.e., where all cell transistors Cell− and Cell+ have not yet been written, the test control transistor Tl′− or Tl′+ connected to one side of bit lines Bit− and Bit+ is switched ON to be connected to the power source Vcc, for falsely setting the memory cell to the status wherein the "H" (1-data) or "L" (0-data) has been written thereto, and thus the read test us conducted. Furthermore, after all memory cells have been written, i.e., where all cell transistors Cell− and Cell+ have been written, the test control transistor Tg′− or Tg′+ connected to one side of bit lines Bit− and Bit+ is switched connected to the ground GND, and the memory cell is falsely set to the status wherein the "L" (0-data) or "H" (1-data) has been written thereto, and thus the read test is conducted.

Next, the test process for the EPROM of FIG. 6 is explained. The test process in this embodiment can be expressed by the flow chart in FIG. 3, but the connecting of the bit lines at the Steps 12, 14, 17 and 19 differs from that of the EPROM shown in FIG. 4

The test processing (the process mainly at Steps 12, 14, 17 and 19) of EPROM shown in FIG. 6 is now described with reference to FIG. 5 and FIG. 6.

As shown in FIG. 5, when the read/write test for the memory cell of the EPROM is first entered at Step 10, all memory cells are erased, for example, by irradiating ultraviolet rays at the Step 11. Next, the connections of bit lines Bit− and Bit+ are controlled at Step 12, and the bit line Bit− connected to the cell transistor Cell− is connected to the power source Vcc. Namely, at the steps prior to Step 16, because the signal ALLW is at a low level "L" and the signal *ALLW is at a high level "H", the outputs of the AND gates LC$_6$, LC$_7$ and LC$_8$ are set to a low level "L" and the output of the AND gate LC$_5$ is set to a high level "H" by setting the signal Data− to a high level "H" and setting the signal Data+ to a low level "L". Therefore, the transistor Tg′+ becomes OFF and the test control transistor Tl′+ becomes OFF and the transistor Tg′− becomes OFF and the test control transistor Tl′− becomes OFF, and therefore, the bit line Bit− is connected to the power source Vcc. The flow then proceeds to the Step 13, and it is determined whether all memory cells can be read out as "H", in the same way as for the EPROM of FIG. 2, and the subsequent Steps 15, 16, 18, 20, 21 and 22 are the same as those shown in FIG. 4.

The flow the proceeds to Step 14, the bit line connection of which is inverse to that at Step 12, i.e., the bit line Bit+ connected to the cell transistor Cell− is connected to the power source Vcc. Concretely, because the signal ALLW is at a low level "L", the outputs of the AND gates LC$_5$, LC$_6$ and LC$_8$ are set to a low level "L" and the output of the AND gate LC$_7$ is set to a high level "H", by setting the signal Data− to a low level "L" and setting the signal Data+ to a high level "H". Therefore, the transistor Tg′+ becomes OFF and the test control transistor Tl′+ becomes ON, and the transistor Tg′− becomes OFF status and the test control transistor Tl′− becomes OFF, so that the bit line Bit+ is connected to the power source Vcc. The flow then proceeds to the Step 15, and it is determined whether all memory cells can be read out as "L".

Next, the flow proceeds to Step 16, and the read process for all memory cells is conducted. Note, during and after the write process for all cells at Step 16, the signal ALLW becomes high level "H".

The flow then proceeds to the Step 17 and the connections of bit line Bit− and Bit+ are controlled, i.e., the bit line Bit+ connected to the cell transistor Cell+ is connected to the ground GND. Namely, at steps following the Step 16, because the signal ALLW is at a high level "H" and the signal *ALLW is at a low level "L", the outputs of the AND gates $LC_5$, $LC_7$ and $LC_8$ are set to a low level "L" and the output of the AND gate $LC_6$ is set to a high level "H" by setting the signal Data− to a low level "L" and setting the signal Data+ to a high level "H". Therefore, the transistor Tg′+ becomes ON and the test control transistor Tl′* becomes OFF and the transistor Tg′− becomes OFF and the test control transistor Tl′− becomes OFF, and therefore, the bit line Bit+ is connected to the ground GND. The flow then proceeds to Step 18, and it is determined whether all memory cells can be read out as "H".

The flow then proceeds to Step 19, the bit line connection of which is inverse to that at the Step 17, i.e., the bit line Bit− connected to the cell transistor Cell− is connected to the ground GND. Namely, at the steps following Step 16, because the signal ALLW is at a high level "H" and the signal *ALLW is at a low level "L", the outputs of the AND gates $LC_5 LC_6$ and $LC_7$ are set to a low level "L" and the output of AND gate $LC_8$ is set to a high level "H" by setting the signal Data− to a high level "H" and setting the signal Data+ to a low level "L". Therefore, the transistor Tg′+ becomes OFF and the test control transistor Tl′+ becomes OFF, and the transistor Tg′− becomes ON and the test control transistor Tl′− becomes OFF, and therefore, the bit line Bit− is connected to the ground GND. The flow then proceeds to Step 20, and it is determined whether all memory cells can be read out as "L". When all memroy cells can be read out as "L", i.e., when the read/write test of "L" for all memory cells is finished, the flow proceeds to Step 22 and the read/write test for the memory cells of the EPROM is regarded as completed, and thus the next test is conducted.

In the embodiments of the erasable non-volatile semiconductor memory device according to the present invention described above, such signal levels as signals ALL, *ALLW, data−, and Data+, as well as the logic gates for controlling the respective test control transistors, can be, of course, designed to have other various structures than those described above.

By making it possible to read out the data when a write process has been conducted at both of a pair of FAMIS transistors Cell+ and Cell− building up a memory cell, and where case the write process has not been conducted at both transistors, the ultraviolet ray erasing process requiring a long time, for example, from several minutes to several tens of minutes, can be reduced by shortening the execution time of the read/write test of the memory cells in the erasable non-volatile semiconductor memory device, according to the erasable non-volatile semiconductor memory device of the present embodiment described above.

Figure 7:
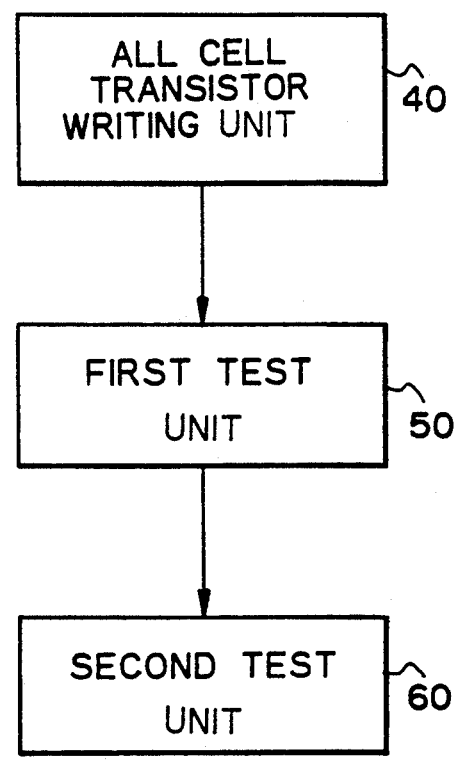
FIG. 7 is a block diagram of a principle of a second aspect of an erasable non-volatile semiconductor memory device according to the present invention.
Figure 8:
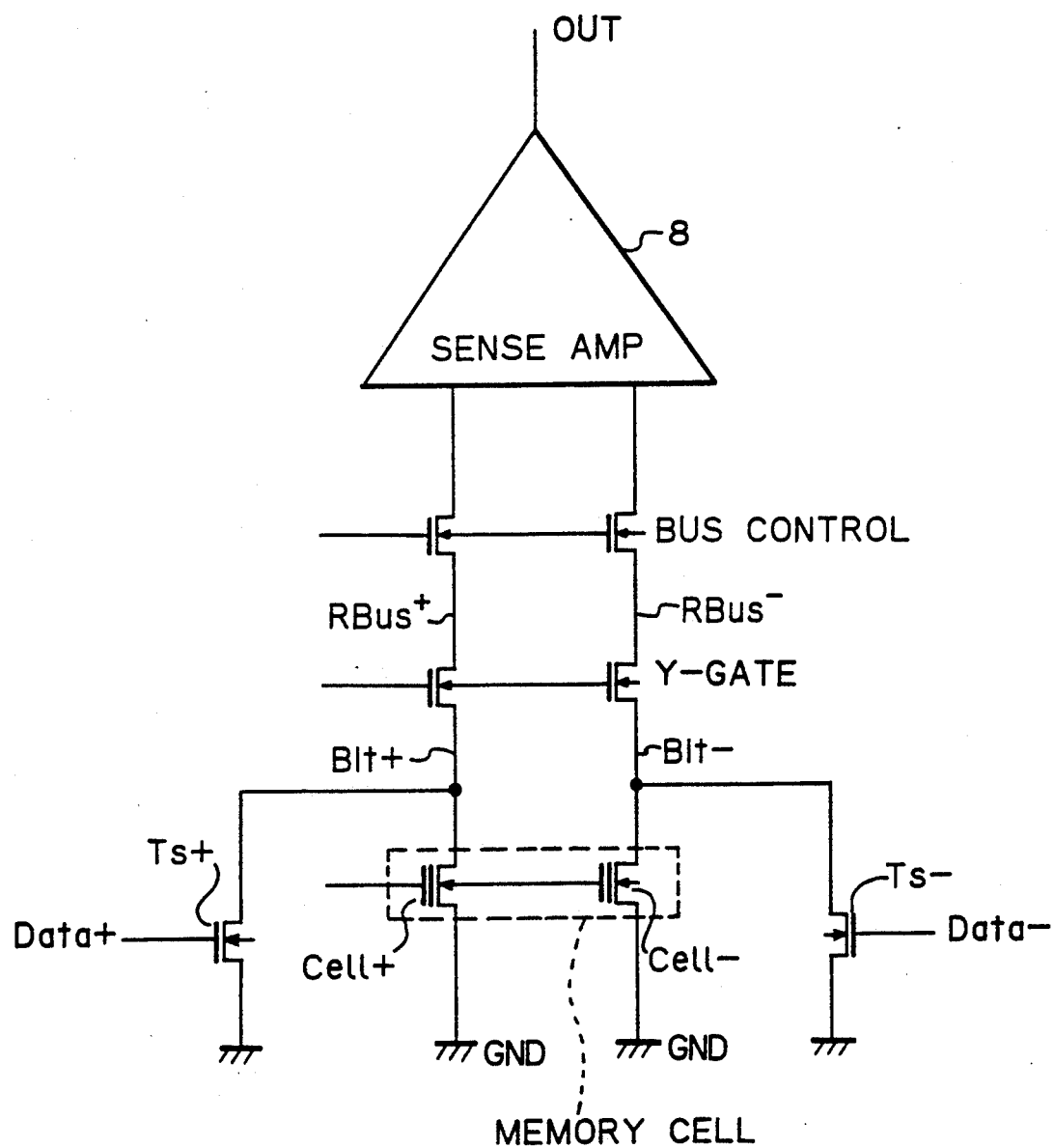
FIG. 8 is a block circuit diagram of another embodiment of the erasable non-volatile semiconductor memory device according to the present invention.

FIG. 7 is a block diagram indicating a principle of a second aspect of an erasable non-volatile semiconductor memory device according to the present invention, and FIG. 9 is a flow chart indicating and example of the test process of the erasable non-volatile semiconductor device shown in FIG. 8.

By comparing FIG. 7 with FIG. 3, it will be understood that blocks 40, 50 and 60 in the second aspect of this erasble non-volatile semiconductor memory device correspond to the blocks 4, 5 and 6 in the first aspect of aforesaid erasble non-volatile semiconductor memory device. Namely, by comparing FIG. 9 with FIG. 5, it can be seen that Steps 31 through 37 in FIG. 9 correspond to Steps 16 through 22 in FIG. 5. Note, Steps 11 to 15 in FIG. 5 are not carried out in this embodiment (FIG. 9), but the test corresponding to Steps 11 to 15 in FIG. 5 may be carried out later.

FIG. 8 is a block circuit diagram indicating another embodiment of the erasble non-volatile semiconductor memory device according to the present invention. In FIG. 8, reference numeral 8 denotes a sense amp, and the write circuit (7) and the read/write control circuit (9) have been omitted.

As shown in FIG. 8, the erasble non-volatile semiconductor memory device (EPROM) of the present embodiment has a structure in which the test control transistors Ts+ and Ts− are added to the erasble non-volatile semiconductor memory device shown as the related art in FIG. 1, wherein the transistor Ts+ is provided between the bit line Bit+ and the ground GND the transistor Ts− is provided between the bit line Bit− and the ground GND. Further, the signal Data+ is supplied to the gate of the transistor Ts+, and the signal Data− is supplied to the gate of the transistor Ts−.

When the read/write test of the memory cells of EPROM is entered first at Step 30, as shown in FIG. 9, the write process for all memory cells is conducted at Step 31. Note, before the all cell write process in Step 31 is executed, the write state memory cells and non-write state memory cells may co-exist, and all memory cells are in the write status at this Step 31.

The flow then proceeds to Step 32, and the connections of bit lines Bit− and Bit+ are controlled, the bit line Bit+ connected to the cell transistor Cell+ being connected to the GND. Concretely, the signal Data+ is set to "H" and the test control transistor Ts+ on one side is made ON. The flow then proceeds to Step 33, and it is determined whether all memory cells can be read out as "H".

The flow then proceeds to Step 34, the bit line of which is inverse to that at the Step 32, i.e., the bit line Bit− connected to the cell transistor Cell− is connected to the ground GND. Concretely, the signal Data− is set to "H" and the test control transistor Ts− on the other side is made to ON. The flow then proceeds to Step 35, and it is determined whether all memory cells can be read out as "L". When all memory cells can be read out as "L" at Step 35, i.e., when the read/write test of "L" for all memory cells is finished, the flow advances to Step 37 and the read/write test of the memory cells of the EPROM is regarded as completed, and thus the next test is conducted.

As shown above, the FAMIS transistor, includes a FAMOS having insulation film between the gate electrode, and wherein the substrate is an oxide film, and further includes a FAMOS having an insulation film made, for example, of a nitride film.

As explained in detail above, by reducing the cycle of the erasing process, which requires a long time, and by falsely reading out the 0-data and 1-data without writing actual data to each memory cell, the test time can be shortened and a low priced product can be supplied according to the present invention.

Many widely differing embodiments of the present invention may be constructed without departing from the spirit and scope of the present invention, and it should be understood that the present invention is not limited to the specific embodiments described in this specification, except as defined in the appended claims.

We claim:

1. An erasable non-volatile semiconductor memory device having a plurality of erasable non-volatile memory cells each comprising two cell transistors, the write statuses of which are inverted, and detecting the write status of each of said memory cells by a differential type detection circuit through first and second bit lines connected respectively to said two cell transistors of said memory cell, to thereby read out the contents of said memory cell, wherein said erasable non-volatile semiconductor memory device comprises:

an all cell transistor erasion means for erasing all of said cell transistors constituting a plurality of said memory cells;
   a first test means for cutting off said first bit line connected to one of said cell transistors from said differential type detection circuit, and for connecting said second bit line connected to the other of said cell transistors of said memory cell to said differential type detection circuit to carry out a test of a first write level;
   a second test means for cutting off said second bit line from said differential type detection circuit, and for connecting said first bit line to said differential type detection circuit to carry out a test of a second write level; an all cell transistor write means for writing all of said cell transistors constituting a plurality of said memory cells;
   a third test means for connecting said second bit line to the ground, and for connecting said first bit line to the ground, and for connecting said first bit line to said differential type detection circuit to carry out a test of the first write level; and
   a fourth test means for connecting said first bit line to the ground, and for connecting said second bit line to said differential type detection circuit to carry out a test of the second write level, to thereby execute a read/write test of all of said memory cells.

2. An erasable non-volatile semiconductor memory device as claimed in claim 1, wherein said cell transistors are constituted by floating gate avalanche injection MIS (FAMIS) transistors.

3. An erasable non-volatile semiconductor memory device as claimed in claim 1, wherein the cutting-off process of either said first bit line or said second bit line is carried out by the switching elements provided between each of two cell transistors of said memory cell and said differential type detection circuit and controlled during a test of said memory cells.

4. An erasable non-volatile semiconductor memory device, having a plurality of erasable non-volatile memory cells each comprising two cell transistors, the write statuses of which are inverted, and detecting the write status of each of said memory cells by a differential type detection circuit through first and second bit lines connected respectively to said two cell transistors of said memory cell, to thereby read out the contents of said memory cell, wherein said erasable non-volatile semiconductor memory device comprises:

an all cell transistor erasion means for erasing all of said cell transistors constituting a plurality of said memory cells;
   a first test means for connecting said first bit line connected to one of said cell transistors to a power supply means to carry out a test of a first write level;
   a second test means for connecting said second bit line connected to the other of said cell transistors to said power supply means to carry out a test of a second write level;
   an all cell transistor write means for writing all of said cell transistors constituting a plurality of said memory cells;
   a third test means for connecting said second bit line to the ground to carry out a test of the first write level; and
   a fourth test means for connecting said first bit line to the ground to carry out a test of the second write level, to thereby execute a read/write test of all of said memory cells.

5. An erasable non-volatile semiconductor memory device as claimed in claim 4, wherein said cell transistors are constituted by floating gate avalanche injection MIS transistors.

6. An erasable non-volatile semiconductor memory device as claimed in claim 4, wherein the first and second bit lines are provided between each of two cell transistors of said memory cell and said differential type detection circuit, and the switching processes between said first and second bit lines and said power supply means and the ground are controlled by switching elements controlled during a test of said memory cells.

7. An erasable non-volatile semiconductor memory device having a plurality of erasable non-volatile memory cells each comprising two cell transistors, the write statuses of which are inverted, and detecting the write status of each of said memory cells by a differential type detection circuit through first and second bit lines connected respectively to said two cell transistors of said memory cell, to thereby read out the contents of said memory cell, wherein said erasable non-volatile semiconductor memory device comprises:

an all cell transistor write means for writing all of said cell transistors constituting a plurality of said memory cells;
   a first test means for connecting said second bit line to the ground to carry out a test of a first write level; and
   a second test means for connecting said first bit line to the ground to carry out a test of a second write level, to thereby execute a read/write test of all of said memory cells.

8. An erasable non-volatile semiconductor memory device as claimed in claim 7, wherein said cell transistors are constituted by floating gate avalanche injection MIS transistors.

9. An erasable non-volatile semiconductor memory device as claimed in claim 7, wherein said first and second bit lines are provided between each of two cell transistors of said memory cell and said differential type detection circuit, and the switching processes between said first and second bit lines and said power supply means and the ground are controlled by switching elements controlled during a test of said memory cells.

10. A read/write test method of an erasable non-volatile semiconductor memory device, having a plurality of erasable non-volatile memory cells each comprising two cell transistors, the write statuses of which are inverted, and detecting the write status of each of said memory cells by a differential type detection circuit through first and second bit lines connected respectively to said two cell transistors of said memory cell to thereby read out the contents of said memory cell, wherein said read/write test method comprises the steps of:

erasing all of said cell transistors constituting a plurality of said memory cells;

cutting off said first bit line connected to one of said cell transistors from said differential type detection circuit, and connecting said second bit line connected to the other of said cell transistors of said memory cell to said differential type detection circuit to carry out a test of a first write level;

cutting off said second bit line from said differential type detection circuit, and connecting said first bit line to said differential type detection circuit to carry out a test of a second write level;

writing all of said cell transistors constituting a plurality of said memory cells;

connecting said second bit line to the ground, and connecting said first bit line to said differential type detection circuit to carry out a test of the first write level; and connecting said first bit line to the ground, and connecting said second bit line to said differential type detection circuit to carry out a test of the second write level, so that the read/write test of all of said memory cells is executed.

11. A read/write test method of an erasable non-volatile semiconductor memory device, having a plurality of erasable non-volatile memory cells each comprising two cell transistors, the write statuses of which are inverted, and detecting the write status of each of said memory cells by a differential type detection circuit through first and second bit lines connected respectively to said two cell transistors of said memory cell to thereby read out the contents of said memory cell, wherein said read/write test method comprises the steps of:

erasing all of said cell transistors constituting a plurality of said memory cells;

connecting said first bit line connected to one of said cell transistors to a power supply means to carry out a test of a first write level;

connecting said second bit line connected to the other of said cell transistors to said power supply means to carry out a test of a second write level;

writing all of said cell transistors constituting a plurality of said memory cells;

connecting said second bit line to the ground to carry out a test of the first write level; and connecting said first bit line to the ground to carry out a test of the second write level, so that the read/write test of all of said memory cells is executed.

12. A read/write test method of an erasable non-volatile semiconductor memory device having a plurality of erasable non-volatile memory cells each comprising two cell transistors, the write statuses of which are inverted, and detecting the write status of each of said memory cells by a differential type detection circuit through first and second bit lines connected respectively to said two cell transistors of said memory cell, to thereby read out the contents of said memory cell, wherein said read/write test method comprises the steps of:

writing all of said cell transistors constituting a plurality of said memory cells;

connecting said second bit line to the ground to carry out a test of a first write level; and connecting said first bit line to the ground to carry out a test of a second write level, to thereby execute a read/write test of all of said memory cells.

* * * * *

UNITED STATES PATENT AND TRADEMARK OFFICE
CERTIFICATE OF CORRECTION

PATENT NO. : 5,237,530

DATED : August 17, 1993

INVENTOR(S) : Nobuaki TAKASHINA et al

It is certified that error appears in the above-identified patent and that said Letters Patent is hereby corrected as shown below:

On the cover page, Item [54], in the title, change "FRASABLE" to "ERASABLE".

Signed and Sealed this

Eighth Day of March, 1994

*Attest:*

BRUCE LEHMAN

*Attesting Officer*  *Commissioner of Patents and Trademarks*